United States Patent
Wimpenny

(10) Patent No.: US 9,490,881 B2
(45) Date of Patent: *Nov. 8, 2016

(54) ENVELOPE TRACKING SYSTEM FOR MIMO

(71) Applicant: SNAPTRACK, INC., San Diego, CA (US)

(72) Inventor: Gerard Wimpenny, Cambourne (GB)

(73) Assignee: QUALCOMM Incorporated, San Diego, CA (US)

(*) Notice: Subject to any disclaimer, the term of this patent is extended or adjusted under 35 U.S.C. 154(b) by 3 days.

This patent is subject to a terminal disclaimer.

(21) Appl. No.: 14/740,851

(22) Filed: Jun. 16, 2015

(65) Prior Publication Data

US 2015/0280795 A1 Oct. 1, 2015

Related U.S. Application Data

(63) Continuation of application No. 14/450,897, filed on Aug. 4, 2014, now Pat. No. 9,077,293, which is a continuation of application No. 13/530,921, filed on Jun. 22, 2012, now Pat. No. 8,803,603.

(30) Foreign Application Priority Data

Jun. 24, 2011 (GB) .................. 1110732.3

(51) Int. Cl.
*H03F 3/68* (2006.01)
*H04B 7/04* (2006.01)
(Continued)

(52) U.S. Cl.
CPC .............. *H04B 7/0417* (2013.01); *H03F 1/02* (2013.01); *H03F 1/0222* (2013.01);
(Continued)

(58) Field of Classification Search
CPC ........... H03F 2203/21181; H03F 2203/21106; H03F 1/0222; H03F 1/3247; H03F 3/24; H03F 3/68; H03F 3/19; H03F 3/211; H03F 3/245; H03F 2200/451; H03F 2201/3215; H03F 2201/3227; H03F 1/02; H03F 3/602; H03F 2200/102; H03F 2200/321; H03F 2200/504; H04B 2001/0425; H04B 7/0417; H04B 7/0413; H04B 1/0475; H04W 52/52

See application file for complete search history.

(56) References Cited

U.S. PATENT DOCUMENTS

| | | | |
|---|---|---|---|
| 6,043,707 A | 3/2000 | Budnik | |
| 6,157,253 A | 12/2000 | Sigmon et al. | |

(Continued)

FOREIGN PATENT DOCUMENTS

| | | |
|---|---|---|
| CN | 101297475 A | 10/2008 |
| GB | 2476388 A | 6/2011 |

(Continued)

OTHER PUBLICATIONS

Officer: Nora Lindner, "Related International Patent Application No. PCT/EP2012/062145", "International Preliminary Report on Patentability", Jan. 9, 2014, Publisher: The International Bureau of WIPO, Published in: CH.

(Continued)

*Primary Examiner* — Dac Ha

(57) ABSTRACT

There is disclosed an amplifier arrangement comprising a plurality of amplifiers each arranged to amplify one of a plurality of different input signals, the arrangement comprising an envelope tracking modulator for generating a common power supply voltage for the power amplifiers, and further comprising an envelope selector adapted to receive a plurality of signals representing the envelopes of the plurality of input signals, and adapted to generate an output envelope signal representing the one of the plurality of envelopes having the highest level at a particular time instant as the input signal for the envelope tracking modulator.

16 Claims, 4 Drawing Sheets

(51) Int. Cl.

| | | |
|---|---|---|
| *H03F 1/02* | (2006.01) | |
| *H03F 1/32* | (2006.01) | |
| *H03F 3/24* | (2006.01) | |
| *H04L 27/36* | (2006.01) | |
| *H04W 52/52* | (2009.01) | |
| *H03F 3/19* | (2006.01) | |
| *H03F 3/21* | (2006.01) | |
| *H04B 7/06* | (2006.01) | |
| *H04B 1/04* | (2006.01) | |
| *H03F 3/60* | (2006.01) | |

(52) U.S. Cl.
CPC ............ *H03F 1/3247* (2013.01); *H03F 3/19* (2013.01); *H03F 3/211* (2013.01); *H03F 3/24* (2013.01); *H03F 3/245* (2013.01); *H03F 3/68* (2013.01); *H04B 1/0475* (2013.01); *H04B 7/0413* (2013.01); *H04B 7/06* (2013.01); *H04L 27/367* (2013.01); *H04W 52/52* (2013.01); *H03F 3/602* (2013.01); *H03F 2200/102* (2013.01); *H03F 2200/321* (2013.01); *H03F 2200/451* (2013.01); *H03F 2200/504* (2013.01); *H03F 2201/3215* (2013.01); *H03F 2201/3227* (2013.01); *H03F 2203/21106* (2013.01); *H03F 2203/21181* (2013.01); *H04B 2001/0425* (2013.01)

(56) References Cited

U.S. PATENT DOCUMENTS

| | | |
|---|---|---|
| 6,255,906 B1 | 7/2001 | Eidson et al. |
| 6,738,432 B2 | 5/2004 | Pehlke et al. |
| 7,263,135 B2 | 8/2007 | Takabayashi et al. |
| 7,706,467 B2 | 4/2010 | Kenington |
| 7,724,839 B2 | 5/2010 | Chen et al. |
| 7,782,132 B2 | 8/2010 | Plotnik et al. |
| 7,852,150 B1 | 12/2010 | Arknaes-Pedersen |
| 8,254,496 B2 | 8/2012 | Takahashi |
| 8,653,886 B2 | 2/2014 | Hellberg |
| 8,803,603 B2 | 8/2014 | Wimpenny |
| 9,077,293 B2 | 7/2015 | Wimpenny |
| 2002/0191710 A1* | 12/2002 | Jeckeln ................. H03F 1/3247 375/296 |
| 2007/0115053 A1 | 5/2007 | Vaisanen et al. |
| 2011/0148705 A1 | 6/2011 | Kenington |
| 2011/0151806 A1 | 6/2011 | Kenington |
| 2012/0235737 A1 | 9/2012 | Reisner et al. |
| 2012/0249238 A1 | 10/2012 | Bartram |
| 2013/0034139 A1* | 2/2013 | Khlat ..................... H03F 1/0227 375/224 |
| 2014/0132354 A1* | 5/2014 | Briffa ..................... H03F 1/025 330/297 |
| 2015/0244325 A1* | 8/2015 | Irvine ................... H03F 1/0216 375/238 |

FOREIGN PATENT DOCUMENTS

| | | |
|---|---|---|
| JP | H04200005 A | 7/1992 |
| JP | 2002290161 A | 10/2002 |
| JP | 2006502599 A | 1/2006 |
| WO | 2007034500 A1 | 3/2007 |
| WO | 2007054609 A1 | 5/2007 |
| WO | 2008013481 A1 | 1/2008 |
| WO | 2010100016 A1 | 9/2010 |

OTHER PUBLICATIONS

"International Patent Application No: PCT/EP2012/062145", "International Search Report and Written Opinion", Sep. 17, 2012, Publisher: ISA / EP, Published in: EP.

"Parent GB Patent Application No. 1110732.3", "Search Report", Nov. 16, 2011, Publisher: UK IPO, Published in: GB.

"U.S. Appl. No. 13/530,921", "Notice of Allowance", Apr. 4, 2014, Published in: US.

"U.S. Appl. No. 13/530,821", "Non-Final Office Action", Aug. 15, 2013, Published in: US.

"U.S. No. 14/450,897", "Notice of Allowance", Mar. 2, 2015, Published in: US.

"U.S. Appl. No. 14/450,897", "Office Action—Ex Parte Quayle Action", Oct. 9, 2014, Published in: US.

* cited by examiner

ENVELOPE TRACKING SYSTEM FOR MIMO

This application is a continuation of U.S. application Ser. No. 14/450,897, filed on Aug. 4, 2014, which issued as U.S. Pat. No. 9,077,293, which is a continuation of U.S. application Ser. No. 13/530,921, filed on Jun. 22, 2012, which issued as U.S. Pat. No. 8,803,603, which claims benefit of priority to Great Britain application number 1110732.3, filed on Jun. 24, 2011. Great Britain patent application number GB 1110732.3, filed on Jun. 24, 2011, is incorporated herein by reference.

FIELD OF THE INVENTION

The present invention relates to an amplification stage incorporating multiple power amplifiers having different input signals. The invention is particularly but not exclusively concerned with multiple power amplifiers in a transmitter of a MIMO system, for example in a cellular infrastructure base station or micro base station of a mobile communication system.

BACKGROUND OF THE INVENTION

MIMO (multiple input, multiple output) systems are well known in the field of mobile telecommunications. A MIMO transmitter generates multiple waveforms from a single signal source, which are amplified by multiple power amplifiers to provide multiple signal paths. The transmitted signals on the multiple paths are detected at one or more receivers.

It is well known in the art of RF power amplification to utilise envelope tracking modulated power supplies for power amplifiers in order to improve various parameters of the power amplifier and in particular the DC (direct current) to RF (radio frequency) power conversion efficiency.

The efficiency of a MIMO system can be improved by providing an envelope tracking modulated power supply for each individual power amplifier in the MIMO transmitter. The envelope tracking power supplies for each power amplifier are modulated so that the power supply voltage tracks the envelope of the input signal to be amplified. In a typical efficient arrangement one of a plurality of power supplies is selected in dependence on the input signal envelope, and then adjusted by an error correction means to more closely track the envelope.

Whilst the use of an envelope tracking modulated power supply provides an efficient amplification arrangement, it increases the overhead associated with the MIMO transmitter since an envelope tracking modulator stage is required for each power amplifier of the MIMO system.

It is an aim of the present invention to provide an improved arrangement for providing an envelope tracking modulated power supply in arrangements where multiple power amplifiers receive different input signals.

SUMMARY OF THE INVENTION

There is provided an amplifier arrangement comprising a plurality of amplifiers each arranged to amplify one of a plurality of different input signals, the arrangement comprising an envelope tracking modulator for generating a common power supply voltage for the power amplifiers.

The amplifier arrangement may further comprise an envelope selector adapted to receive a plurality of signals representing the envelopes of the plurality of input signals, and adapted to generate an output envelope signal representing the one of the plurality of envelopes having the highest level at a particular time instant as the input signal for the envelope tracking modulator. The envelope selector may be arranged to generate a composite envelope signal as the output envelope signal. The composite envelope signal may transition between the envelopes of ones of the plurality of different input signals in dependence upon the one of the plurality having the instantaneous largest amplitude.

The amplifier arrangement may further comprise a plurality of envelope processing stages each for receiving one of the plurality of input signals and for generating a signal representing the envelope of said input signal. Each of the envelope processing stages may include a non-linear mapping stage for mapping its input to its output. Each of the envelope processing stages may include a delay for delaying the signal in the supply path relative to the signal in the input path to the amplifier.

The amplifier arrangement may further comprise a moving average filter to remove discontinuities from the composite envelope signal.

The amplifier arrangement may further comprise a plurality of pre-distortion stages, for receiving the respective plurality of input signals, and further arranged to receive said composite envelope signal, and provide a pre-distorted input signal to the input of the respective power amplifier.

The amplifier arrangement may further comprise a feedback receiver arranged to selectively receive the output of one of the plurality of amplifiers and selectively provide an additional input to the one of the plurality of pre-distortion stages associated with the amplifier, to adaptively adjust the pre-distortion coefficients of the pre-distortion stage to minimise distortion at the output of the amplifier. The feedback receiver may be arranged to switch between all of the plurality of amplifiers in a sequence.

The plurality of input signals may be derived from a common signal source.

A multi-input, multi-output, MIMO, transmitter stage may include an amplifier arrangement as defined. The MIMO transmitter stage may be for use in a cellular base station.

The invention may further provide a method of amplification in an amplifier arrangement comprising a plurality of amplifiers each arranged to amplify one of a plurality of different input signals, the method comprising providing an envelope tracking modulator for generating a common power supply voltage for the power amplifiers.

The method may further comprise receiving a plurality of signals representing the envelopes of the plurality of input signals, and generating an output envelope signal representing the one of the plurality of envelopes having the highest level at a particular time instant as the input signal for the envelope tracking modulator.

BRIEF DESCRIPTION OF THE FIGURES

The present invention is now described by way of example with reference to the accompanying Figures in which.

DETAILED DESCRIPTION

The invention will now be described with further reference to the exemplary RF amplification architecture of a MIMO transmitter system of a mobile communication system. Whilst the invention and its embodiments may be advantageously utilised in such an environment, the invention and its embodiments are not limited in their applicability to the exemplary architectures and implementations as illustrated.

Figure 1:
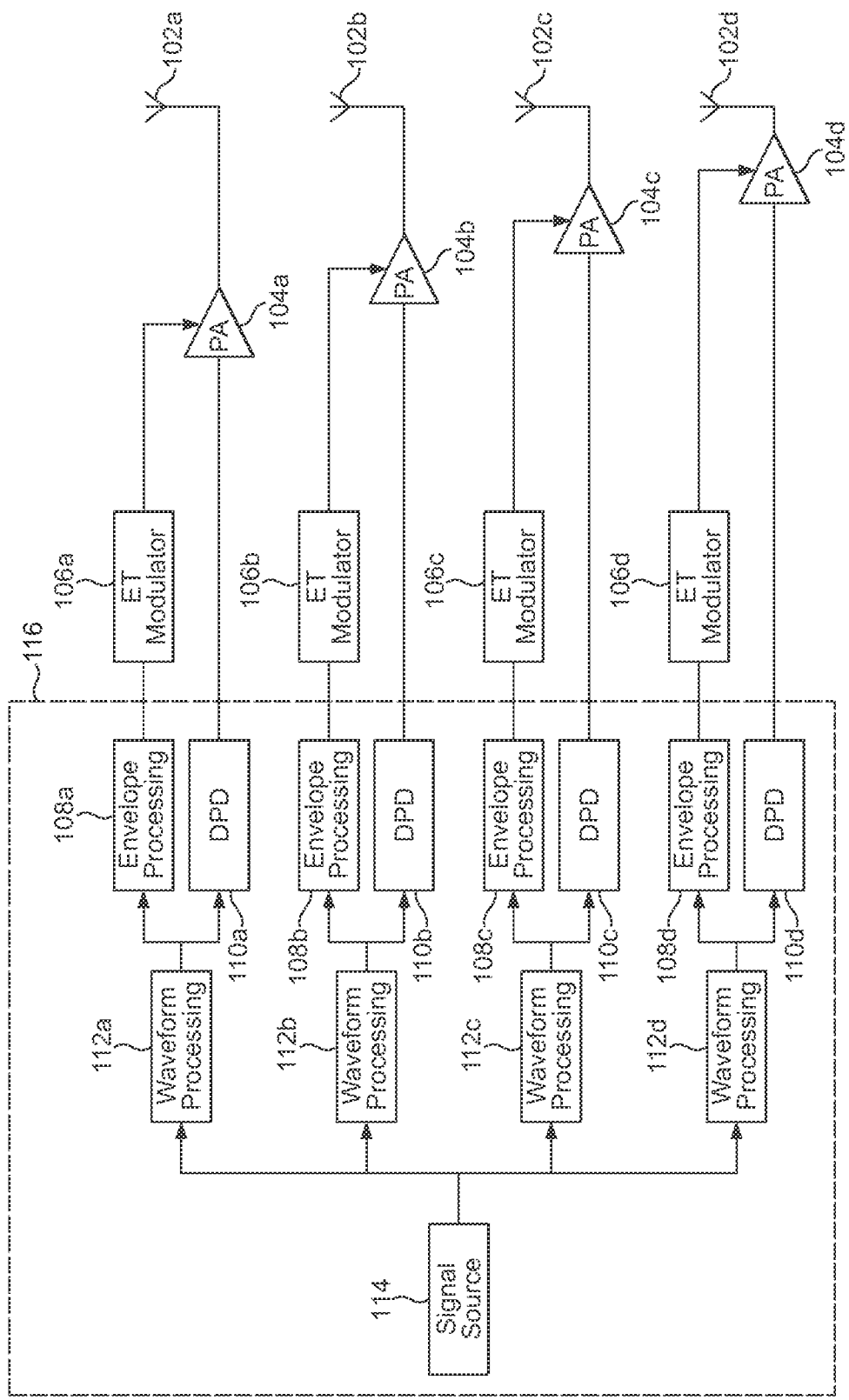
FIG. 1 illustrates an example of a prior art MIMO system.

With reference to FIG. 1 there is illustrated an implementation of conventional envelope tracking techniques in a MIMO transmitter.

The MIMO transmitter includes a digital signal processing block including a signal source 114, a plurality of waveform processing blocks 112a to 112d, a plurality of envelope processing blocks 108a to 108d; and a plurality of digital pre-distortion blocks 110a to 110d; a plurality of envelope modulators 106a to 106d; a plurality of RF amplifiers 104a to 104d; and a plurality of antennas 102a to 102d.

The signal source 114 may generate a signal for transmission on a wireless interface configured in accordance with an appropriate telecommunications standard. The signal source 114 provides a baseband signal which forms an input to each of the plurality of waveform processing blocks, denoted by reference numerals 112.

In the arrangement of FIG. 1 there is provided four waveform processing blocks denoted 112a to 112d. In general there may be provided any number of waveform processing blocks.

Each waveform processing block 112a to 112d provides a waveform at its output which is a baseband signal representative of the RF waveform carried by one channel of the MIMO transmitter, and is typically a digital representation of the baseband in-phase and quadrature (I and Q) signals of the RF carrier to be transmitted. This processing may include crest factor reduction of the waveform.

The waveform at the output of each waveform processing block 112a to 112d is provided at an input of respective envelope processing blocks 108a to 108d and an input of respective DPD blocks 110a to 110d. Consistent with the provision of four waveform processing blocks there are provided four envelope processing blocks and four DPD blocks. An alternative implementation is for the input to the envelope processing block 108 to be taken from the output of DPD block 110.

Each envelope processing block determines the envelope of the respective baseband waveform generated by the respective waveform processing block, and may provide a non-linear mapping between said envelope and the desired supply voltage. Such non-linear mapping provides a 'shaped' envelope waveform. Without such mapping, the envelope waveform is 'unshaped'. The envelope processing block may also contain a variable delay element to allow the timing between the supply path to the respective amplifier and the RF input path to that amplifier to be aligned.

Each DPD block 110 corrects for amplitude and phase distortion of its associated power amplifier. Typically the parameters of each DPD block are updated by monitoring the associated power amplifier output and adjusting the parameters to minimise the distortion of the associated power amplifier output.

The outputs of the envelope processing blocks 108 and DPD processing blocks 110 form the outputs of the digital signal processing block 116.

There are provided a similar plurality of envelope modulators 106 and power amplifiers 104. Thus in the described arrangement there are provided four envelope modulators 106a to 106d and four power amplifiers 104a to 104d. Again, in general, there may be provided any number of envelope modulators and power amplifiers.

It should be noted that FIG. 1 illustrates the main elements of the exemplary transmitter, but not all of the required elements. For example intermediate functional blocks may be needed between the DPD blocks and the power amplifiers, such as digital-to-analogue converters, baseband to RF upconversion circuitry, power amplifier driver etc.

The outputs of the envelope processing blocks 108 provide inputs to the respective envelope tracking modulators 106, and the outputs of the DPD blocks 110 provide inputs to the respective power amplifiers 104.

The outputs of the respective envelope tracking modulators 106 provide inputs to the power supply terminals of the respective power amplifiers 104. As known in the art, the envelope tracking modulators 106a to 106d track the respective envelope signals to deliver an efficient modulated power supply to the respective power amplifiers 104a to 104d.

As can be seen in FIG. 1, a separate envelope tracking modulator is provided for each of the multiple paths, such that there is a one-to-one arrangement between envelope modulators and power amplifiers. Each individual power amplifier 104a to 104d receives its own envelope modulated power supply from its own envelope modulator 106a to 106d.

The output of each power amplifier is connected to a respective antenna 102. Again, in the described example, there are four antennas 102a to 102d associated with each of the respective power amplifiers 104a to 104d.

The power amplifiers 104 feed the individual antennas 102, and in the receiver there is provided multiple antennas for detecting the transmitted signals. Such a MIMO implementation provides many more paths between transmitters and receivers than a single antenna system. Different signals are amplified from the same source, and effectively constitute independent waveforms.

Figure 2:
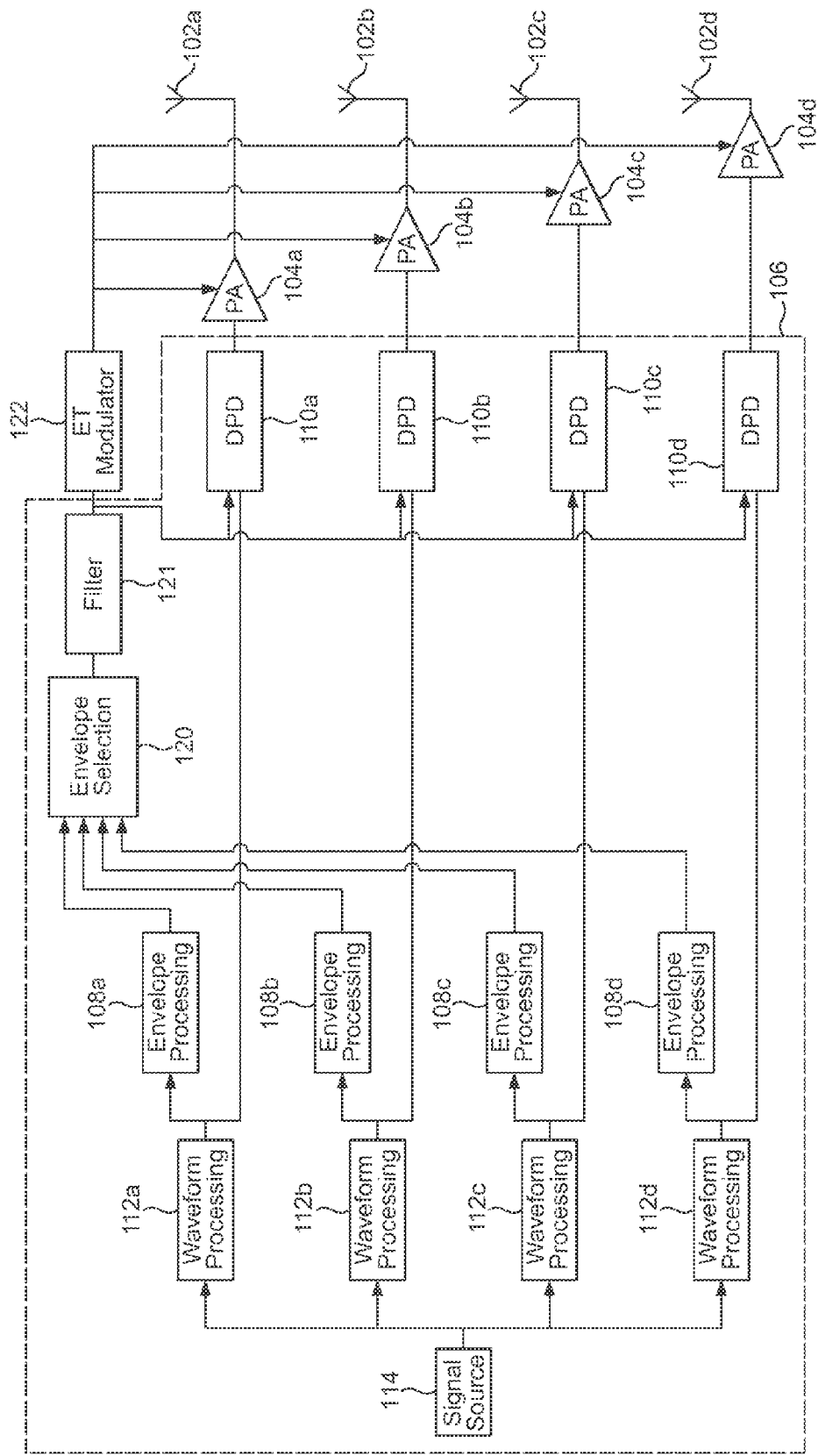
FIG. 2 illustrates an example of a MIMO system incorporating an embodiment of the present invention.

With reference to FIG. 2 there is illustrated an embodiment of an envelope tracking system for a MIMO architecture in accordance with the principles of the present invention. Where elements of FIG. 2 correspond to elements of FIG. 1 like reference numerals are used. The embodiment is described as an improvement to the exemplary arrangement of FIG. 1.

In accordance with the invention individual channels are still provided, with individual waveforms being processed in specific envelope processing blocks 108a to 108d and DPD processing blocks 110a to 110d. The plurality of power amplifiers 104a to 104d are provided, each still receiving the respective input signals for amplification from the outputs of the DPD processing blocks 110a to 110d.

In accordance with the invention, the outputs of each of the envelope processing blocks 108a to 108d are provided as inputs to an envelope selection block 120 within the digital signal processing block 116. The envelope selection block 120 then provides an output to a single envelope tracking modulator 122. The single envelope tracking modulator 122 then provides the modulated power supply signals for all of the power amplifiers 104a to 104d.

The provision of the single envelope tracking modulator 122 to replace the set of envelope tracking modulators of FIG. 1 introduces a potential problem, in that there is no longer a one-to-one correspondence between the supply voltage to an individual power amplifier and the RF envelope at the input of that power amplifier for any instant in time. As a consequence it is no longer possible to determine the required DPD pre-correction with knowledge of only the instantaneous RF input power.

For each power amplifier 104a to 104b it is a requirement that the supply voltage is higher than the minimum supply voltage which results in hard compression in the power amplifier in order for pre-distortion of the RF path to be possible.

The envelope selection block 120 is therefore arranged to determine the maximum envelope signal from the individual envelope signals provided from amongst the envelope processing blocks 108a to 108d. The envelope modulator 122 then generates a modulated power supply signal at its output in dependence upon the one of the multiple envelope signals which is the highest at any one instant. The power supply to all of the power amplifiers 104a to 104d at any instant in time is thus based on the one of the envelopes that is the highest.

The envelope selection block 120 and the envelope tracking modulator 122 thereby ensure that all power amplifiers have a sufficiently high supply voltage to allow pre-distortion of the RF input path to correct for the supply voltage induced distortion.

Figure 3:
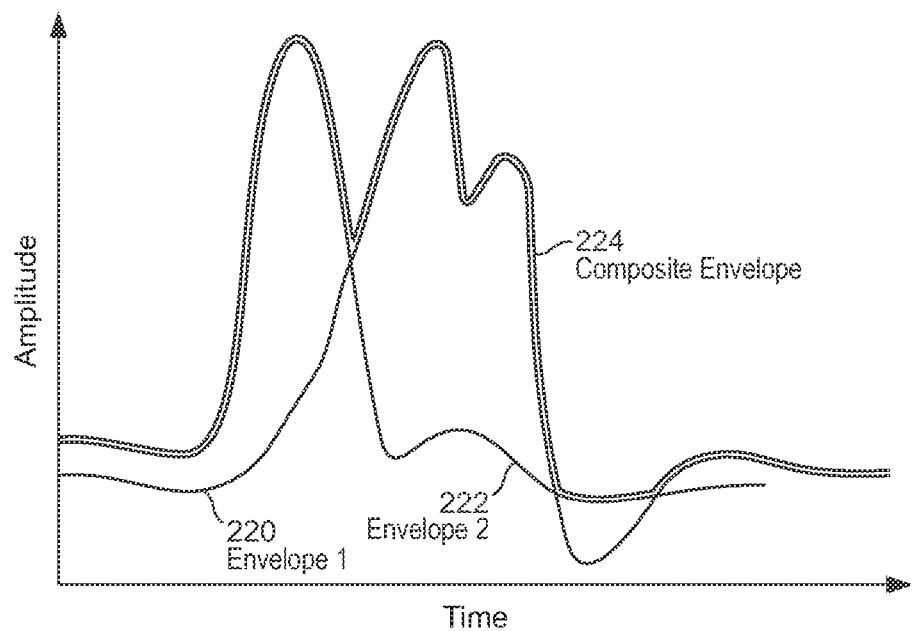
FIG. 3 illustrates exemplary waveforms in an embodiment of the invention.

The operation of the envelope tracking modulator 122 can be further understood with reference to FIG. 3. FIG. 3 illustrates the plots of two envelope waveforms denoted by reference numerals 220 and 222, and a waveform 224 representing the composite signal formed by those waveforms. As can be seen at any instant the composite envelope 224 comprises the one of the individual envelopes 220 and 222 which has the largest amplitude.

The envelope selection block 120, as noted above, is adapted to determine the highest envelope signal at any instant, and thus will output different envelope signals in accordance with its determinations. Short cusps may occur where the envelope selection block 120 jumps from one waveform to another waveform. A moving average filter may thus be provided at the output of the envelope processing block 120, as represented by block 121 in FIG. 2, in order to smooth the transition points. Such a moving average filter also ensures that a higher voltage than is needed is always provided as the supply voltage.

Figure 4:
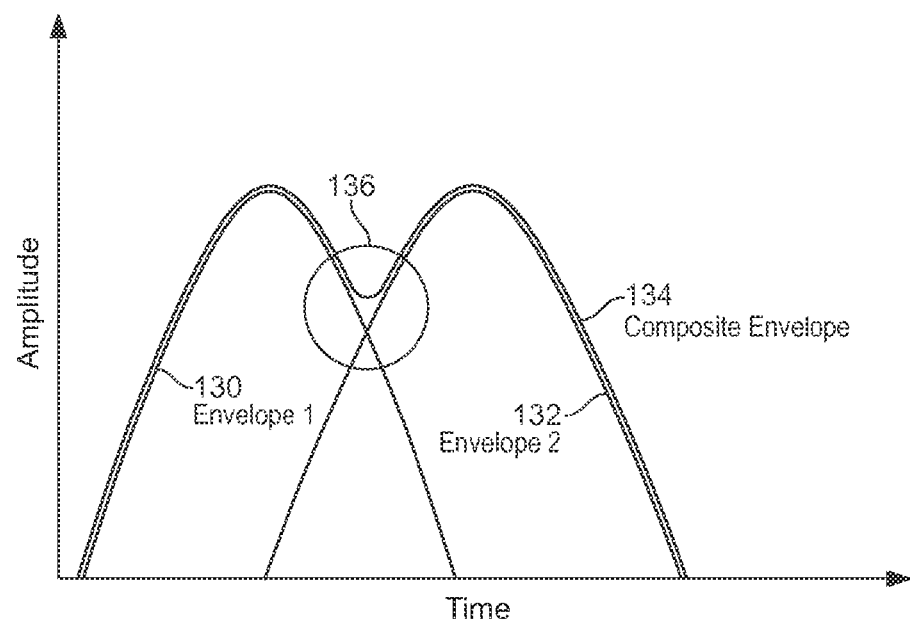
FIG. 4 illustrates a modification to the arrangement of FIG. 2 in a further embodiment.

This is further illustrated with respect to FIG. 4. First and second waveforms 130 and 132 represent two envelopes, and waveform 134 represents a composite of those envelopes. As can be seen by the region denoted by reference numeral 136, a short cusp appears as the composite envelope is determined by one envelope and then another, i.e. as the composite envelope 'jumps' from one envelope to another envelope.

Thus in accordance with the invention a single envelope tracking modulator can be used to drive all power amplifiers.

A further problem arises because the instantaneous output power of a power amplifier is dependent on both its instantaneous input power and its instantaneous supply voltage. A conventional DPD only has knowledge of the instantaneous input power and hence cannot systematically correct for power amplifier output power errors which result from changes in instantaneous supply voltage which are uncorrelated with the instantaneous input power.

To address this problem, each of the DPD processing blocks 110a to 110d is provided with information on the instantaneous supply voltage to the power amplifiers as well as a digital representation of the baseband I and Q components of its respective RF carrier for its respective amplifier. The information of the instantaneous supply voltage is provided from the output of filter block 121 as shown in FIG. 2. With the power supply voltage information and the baseband I and Q information the DPD can correct for distortion.

The specific DPD processing to correct for distortion based on these inputs will be implementation dependent.

The DPD pre-correction applied to each power amplifier in the respective DPD blocks 110 may be fixed or adaptive. Where fixed pre-correction is used this may be predetermined by design, or adjusted at device manufacture.

Where adaptive pre-correction is used, a receiver may be used to sample the power amplifier output signal thereby creating a feedback path for adaptation of the DPD parameters. As the required update rate of the DPD parameters is very low, the feedback receiver may be multiplexed between all transmit channels, as indicated in FIG. 5.

Figure 5:
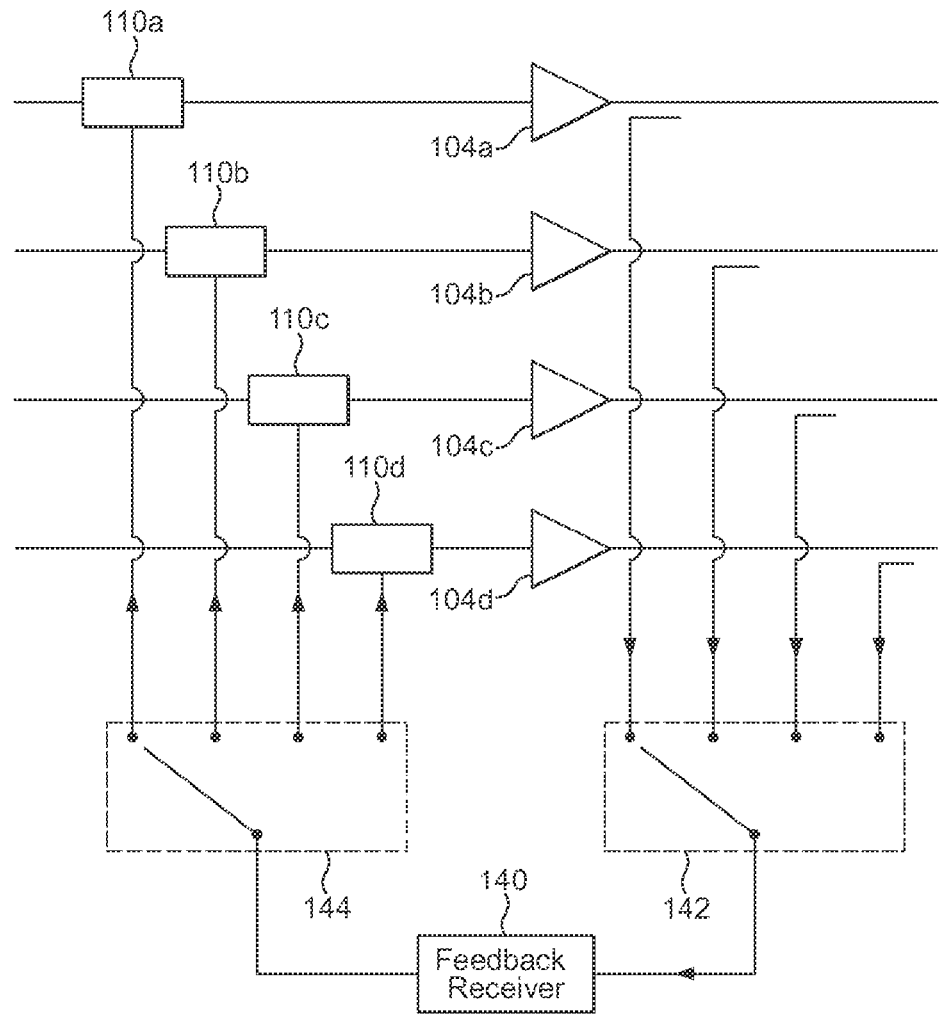
FIG. 5 illustrates further exemplary waveforms in an embodiment of the invention.

As shown in FIG. 5, the arrangement of FIG. 2 may be further modified in such an adaptive arrangement to include a feedback receiver 140, an output switch 142 and an input switch 144. The output switch 142 is controlled to select one of the outputs of the power amplifiers 104a to 104d to the feedback receiver 140, and the input switch 144 is controlled to connect the output of the feedback receiver 140 to an additional input of one of each of the DPD blocks 110a to 110d.

The switches 142 and 144 are controlled by a common control signal such that when the output of one of the amplifiers 104a to 104d is selected, the input to the corresponding DPD block is also selected. The switches may be controlled to switch in fixed periods following a predetermined cycle.

In general, therefore, a single envelope tracking modulator is used for providing a modulated supply voltage to multiple power amplifiers where each of the multiple power amplifiers has a different input signal. In general, the inventive techniques applies to any such arrangement which does not provide in a one-to-one mapping between instantaneous supply voltage and instantaneous RF input envelope, not just a MIMO arrangement.

The invention is described herein with reference to particular examples and embodiments, which are useful for understanding the invention and understanding a preferred implementation of the invention. The invention is not, however, limited to the specifics of any given embodiment, nor are the details of any embodiment mutually exclusive. The scope of the invention is defined by the appended claims.

What is claimed is:

1. A pre-distortion stage for an amplifier arrangement comprising: an input for receiving one of a plurality of input signals; an input for receiving a composite envelope signal, the composite envelope signal representing an envelope of the one of the plurality of input signals having the highest level at a particular time instant; and an output for providing a pre-distorted input signal to one of a plurality of power amplifiers.

2. The pre-distortion stage of claim 1 wherein each of the plurality of amplifiers receives a common supply voltage in dependence on the composite envelope signal.

3. A plurality of pre-distortion stages according to claim 1, each for receiving one of the respective plurality of input signals, each for receiving the composite envelope signal, and each for providing a pre-distorted input signal to the input of a respective power amplifier.

4. The pre-distortion stage of claim 1 further comprising an input for selectively receiving an output from a feedback receiver, the feedback receiver arranged to selectively receive the output of one of the plurality of power amplifiers to adaptively adjust the pre-distortion coefficients of the pre-distortion stage to minimize distortion at the output of the associated power amplifier.

5. The amplifier of claim 4 wherein the feedback receiver is arranged to switch between all of the plurality of amplifiers in a sequence.

6. The pre-distortion stage of claim 1 wherein the input signal is derived from a signal source common to inputs to other pre-distortion stages.

7. A multi-input, multi-output, MIMO, transmitter stage including a pre-distortion stage according to claim 1.

8. The MIMO transmitter stage of claim 7 for use in a cellular base station.

9. A method for pre-distorting in an amplifier arrangement comprising: receiving one of a plurality of input signals; receiving a composite envelope signal, the composite envelope signal representing an envelope of the one of the plurality of input signals having the highest level at a particular time instant; and in dependence on the received signals providing a pre-distorted signal to one of a plurality of power amplifiers.

10. The method of claim 9 further comprising receiving a common supply voltage in dependence on the composite envelope signal at each of the plurality of amplifiers.

11. A method according to claim 9, further comprising receiving one of the respective plurality of input signals at one of a plurality of pre-distortion stages, receiving the composite envelope signal at each of the plurality of pre-distortion stages, and providing a pre-distorted signal to the input of a respective power amplifier from each pre-distortion stage.

12. The method of claim 9 further comprising selectively receiving an output from a feedback receiver arranged to selectively receive the output of one of the plurality of power amplifiers, and adaptively adjusting pre-distortion coefficients to minimize distortion at the output of the associated power amplifier.

13. The method of claim 12 wherein the feedback receiver is arranged to switch between all of the plurality of amplifiers in a sequence.

14. The method of claim 9 further comprising deriving the input signal from a signal source common to inputs to other pre-distortion stages.

15. The method of claim 9 in a multi-input, multi-output, MIMO, transmitter stage.

16. The method of claim 15 in a cellular base station.

* * * * *